US006992364B2

(12) United States Patent
Yoo et al.

(10) Patent No.: US 6,992,364 B2
(45) Date of Patent: Jan. 31, 2006

(54) ARRAY SUBSTRATE FOR USE IN LCD DEVICE AND METHOD OF FABRICATING SAME

(75) Inventors: Soon-Sung Yoo, Kyoungsangbuk-do (KR); Dong-Yeung Kwak, Taegu (KR); Hu-Sung Kim, Seoul (KR); Yu-Ho Jung, Kyoungsangbuk-do (KR); Yong-Wan Kim, Kyoungsangbuk-do (KR); Duk-Jin Park, Taegu (KR); Woo-Chae Lee, Kyoungsangbuk-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/653,283

(22) Filed: Sep. 3, 2003

(65) Prior Publication Data

US 2004/0043545 A1 Mar. 4, 2004

Related U.S. Application Data

(62) Division of application No. 09/779,438, filed on Feb. 9, 2001, now Pat. No. 6,627,470.

(30) Foreign Application Priority Data

Feb. 11, 2000 (KR) ................................ 2000-6450

(51) Int. Cl.
*H01L 29/00* (2006.01)

(52) U.S. Cl. ....................... 257/522; 438/411; 438/421

(58) Field of Classification Search ................ 257/250, 257/522, 410; 349/43, 47; 438/30, 160, 438/149, 151, 411, 421
See application file for complete search history.

(56) References Cited

U.S. PATENT DOCUMENTS

| | | | |
|---|---|---|---|
| 5,355,011 A | | 10/1994 | Takata |
| 5,552,909 A | | 9/1996 | Onisawa et al. |
| 5,602,047 A | | 2/1997 | Tsai et al. |
| 5,605,847 A | * | 2/1997 | Zhang ........................ 438/164 |
| 5,610,082 A | | 3/1997 | Oh |
| 5,672,523 A | | 9/1997 | Yamamoto et al. |
| 5,811,328 A | | 9/1998 | Zhang et al. |
| 5,814,836 A | | 9/1998 | Hyun |

(Continued)

*Primary Examiner*—W. David Coleman
*Assistant Examiner*—Khiem Nguyen
(74) *Attorney, Agent, or Firm*—Morgan Lewis & Bockius LLP

(57) ABSTRACT

A TFT array substrate has a PAI pattern, and the PAI pattern has an over-etched portion of the pure amorphous silicon layer. This over-etched portion prevents a short between the pixel electrode and the pure amorphous silicon layer (i.e., the active layer). The over-etched portion also enables the aperture ratio to increase a gate line over a said substrate; a data line over the said substrate being perpendicular to the gate line; a passivation layer covering the data line, the passivation layer divided into a residual passivation layer and a etched passivation layer; a doped amorphous silicon layer formed under the data line and corresponding in size to the data line; a pure amorphous silicon layer formed under the doped amorphous silicon layer and having a over-etched portion in the peripheral portions, wherein the over-etched portion is over-etched from the edges of the residual passivation layer toward the inner side; an insulator layer under the pure amorphous silicon layer; a TFT formed near the crossing of the gate line and the data line; and a pixel electrode overlapping the data line and contacting the TFT.

5 Claims, 5 Drawing Sheets

U.S. PATENT DOCUMENTS 5,844,647 A 12/1998 Maruno et al.
5,886,761 A 3/1999 Sasaki et al.
5,917,563 A 6/1999 Matsushima
5,920,082 A 7/1999 Kitazawa et al.
5,963,797 A 10/1999 Hyun
5,969,702 A 10/1999 Bae
5,982,460 A 11/1999 Zhang et al.
6,067,132 A 5/2000 Kim
6,078,365 A 6/2000 Ueda et al.
6,097,453 A 8/2000 Okita
6,195,140 B1 2/2001 Kubo et al.
6,207,480 B1 * 3/2001 Cha et al. .................. 438/149
6,274,400 B1 8/2001 Jen
6,562,671 B2 * 5/2003 Ohnuma .................... 438/160
6,624,013 B2 * 9/2003 Kawasaki et al. .......... 438/160
6,875,645 B2 * 4/2005 Lai ........................... 438/151

* cited by examiner

ARRAY SUBSTRATE FOR USE IN LCD DEVICE AND METHOD OF FABRICATING SAME

This is a divisional of application Ser. No. 09/779,438, filed on Feb. 9, 2001 now U.S. Pat. No. 6,627,470.

This application claims the benefit of Korean Patent Application No. 2000-6450, filed on Feb. 11, 2000, which is hereby incorporated by reference.

BACKGROUND OF THE INVENTION

1. Field of the Invention

The present invention relates to a liquid crystal display (LCD) device, and more particularly, to an array substrate for use in a LCD device having thin film transistors (TFTs) and to a method of manufacturing the same.

2. Description of Related Art

In general, a liquid crystal display (LCD) device displays an image using a plurality of pixels. An LCD device that uses thin film transistors (TFTs) as switching elements is typically called a thin film transistor liquid crystal display (TFT-LCD) device.

A liquid crystal display device uses the optical anisotropy and polarization properties of liquid crystal molecules. Because of their peculiar characteristics liquid crystal molecules have a definite orientational order in arrangement. The arrangement direction of liquid crystal molecules can be controlled by an applied electric field. In other words, when electric fields are applied to liquid crystal molecules, the arrangement of the liquid crystal molecules changes. Since incident light is refracted according to the arrangement of the liquid crystal molecules, due to the optical anisotropy of liquid crystal molecules, image data can be displayed.

An active matrix LCD (AM-LCD) has its thin film transistors (TFTs) and pixel electrodes arranged in a matrix. Such LCDs can have high resolution and superior imaging of moving images.

FIG. 1 is a cross-sectional view illustrating a conventional liquid crystal display (LCD) panel. As shown in FIG. 1, the LCD panel 20 has lower and upper substrates 2 and 4 with a liquid crystal layer 10 interposed therebetween. The lower substrate 2, which is referred to as an array substrate, has a TFT "S" as a switching element that changes the orientation of the liquid crystal molecules. A pixel electrode 14 applies a voltage to the liquid crystal layer 10 according to the state of the TFT "S". The upper substrate 4 has a color filter 8 for implementing a color and a common electrode 12 on the color filter 8. The common electrode 12 serves as an electrode for applying a voltage to the liquid crystal layer 10. The pixel electrode 14 is arranged over a pixel portion "P", of a display area. Further, to prevent leakage of the liquid crystal layer 10, the two substrates 2 and 4 are sealed using a sealant 6.

FIG. 2 is a partial plan view illustrating an array substrate of a conventional LCD device. A gate line 22 is arranged in a transverse direction and a data line 24 is arranged in perpendicular to the gate line 22. A pixel region having a pixel electrode 14 is defined by the gate line 22 and the data line 24.

In an AM-LCD, the switching element (TFT "S") that selectively applies the voltage to the liquid crystal layer 10 (see FIG. 1) is formed near the crossing of the gate line 22 and the data line 24. The TFT "S" has a gate electrode 26 that is extended from the gate line 22, a source electrode 28 that is extended from the data line 24, and a drain electrode 30 that is electrically connected to the pixel electrode 14 via a contact hole 31. The gate line 22 and the pixel electrode 14 form a storage capacitor "$C_{st}$" which stores electric charges. The passivation layer 40 is arranged to protect the data line 24 and the TFT "S".

When the gate electrode 26 of the TFT "S" receives gate signals via the gate line 22, the TFT "S" turns ON. The data signals on the data line 24 are then applied to the pixel electrode 14. The applied electric field from the pixel electrode 14 then changes the arrangement direction of the liquid crystal molecules, causing the liquid crystal molecules to refract the light generated by a back light device. When the gate line 22 turns the TFT "S" to the OFF-state, data signals are not transmitted to the pixel electrode 14. In this case, the arrangement of the liquid crystal is not changed, and thus the direction of the light from back light device is not changed.

When fabricating a liquid crystal panel, a number of complicated process steps are required. In particular, the TFT array substrate requires numerous mask processes. Each mask process requires a photolithography process. Thus, to reduce cost and manufacturing time, the number of mask processes should be minimized.

In general, a manufacturing process depends on the materials used and on the design goals. For example, the resistivity of the material used for the gate lines and the data lines impacts the picture quality of large LCD panels (over 12 inches) and of LCD panels having high resolution. With such LCD panels, a material such as Aluminum (Al) or Al-alloy is often used for the gate lines.

FIGS. 3A to 3D are cross-sectional views taken along line III—III and illustrate the process steps of fabricating a conventional TFT array substrate for an active matrix LCD device.

An inverted staggered type TFT is generally used due to its simple structure and superior efficiency. The inverted staggered type TFT can be classified as either a back channel etched type (EB) and an etch stopper type (ES), depending on the fabrication method that is used. The fabrication method of the back channel etched type TFT will now be explained.

A first metal layer is deposited on a substrate 1 by a sputtering process. The substrate previously underwent a cleaning process to enhance adhesion between the substrate 1 and the first metal layer. That cleaning process removes organic materials and alien substances from the substrate.

FIG. 3A shows a step of forming a gate electrode 26 by patterning the first metal layer. The gate electrode 26 is usually Aluminum, which reduces the RC delay owing to a low resistance. However, pure Aluminum is delicate to the acid, and it may result in line defects caused by formation of hillocks during a subsequent high temperature process. Thus, an Aluminum alloy or another material is beneficially used.

Referring to FIG. 3B, an insulator layer 50 is formed over the surface of the substrate 1 and over the gate electrode 26. Then, a pure amorphous silicon (a-Si:H) layer 52 as an active layer and a doped amorphous silicon ($n^+$ a-Si:H) layer 54 as an ohmic contact layer are formed in sequence on the insulator layer 50. The ohmic contact layer 54 reduces the contact resistance between the active layer 52 and electrodes that will be formed later. After that, a data line 24 and source and drain electrodes 28 and 30 are formed by depositing and patterning a second metal layer. A portion of the doped amorphous silicon layer 54 on the pure amorphous silicon layer 52 is etched using the data line 24 and source and drain electrodes 28 and 30 as masks. At this time, a channel region "CH" is formed by removing the portion of the doped amorphous silicon layer 54 using the source and drain electrodes 28 and 30 as masks. If the doped amorphous silicon layer 54 between the source and drain electrodes 28 and 30 is not removed, serious problems that deteriorates electrical characteristics of the TFT "S" (see FIG. 2) can result. Thus, these cause low efficiencies of the TFT "S" (see FIG. 2). Etching the portion of the doped amorphous silicon layer 54 over the gate electrode 26 requires special attention. While etching the doped amorphous silicon layer 54, the pure amorphous silicon layer 52 is typically over-etched by about 50~100 due to the fact that the pure amorphous silicon layer 52 and the doped amorphous silicon layer 54 have no etch selectivity. In this step, moreover, etching uniformity is very important because it affects the characteristics and properties of the TFT. And then a passivation layer 40 is formed over the pure amorphous silicon layer 52, over the data line 24 and over the source and drain electrodes 28 and 30.

Referring to FIG. 3C, the passivation layer 40 is etched to form a drain contact hole 31 that is used to connect the drain electrode 30 to a pixel electrode that is formed later. At this time, as shown in FIG. 3C, a portion of the passivation layer 40, except the portion covering the data line 24 and the source and drain electrodes 28 and 30, is etched. Moreover, the active layer 52 (the pure amorphous silicon layer) and the insulator layer 50, except the portion below the second metallic layer, are etched at the same time.

FIG. 3D also shows a step of forming a pixel electrode 14 by depositing and then patterning a transparent conductive material such as Indium Tin Oxide (ITO) or Indium Zinc Oxide (IZO). Therefore, as shown in FIG. 3D, the pixel electrode 14 contacts the drain electrode 30 via the drain contact hole 31, while the pixel electrode 14 depicted at the left side of FIG. 3D is spaced apart from the data line 24.

As described above, since the conventional array substrate for use in the LCD device is fabricated using a four-mask process, manufacturing yields increase and misalignment is reduced. However, as shown in FIG. 4 that is enlarged view illustrating potion "A" of FIG. 2, an abnormal pixel electrode 15 can be formed when forming the pixel electrode 14. The abnormal pixel electrode 15 causes the LCD device to have point defects by connecting the pixel electrode 14 to the pure amorphous silicon layer 52. The detailed explanation will be explained referring to FIG. 5.

FIG. 5 is a cross-sectional view taken along line—of FIG. 4 and illustrates the point defects caused by the abnormal pixel electrode 15. As shown, the pure amorphous silicon layer 52 is exposed by the etching process that simultaneously etches the passivation layer 40, the pure amorphous silicon layer 52 and the insulator layer 50, as described in FIG. 3C. If the abnormal pixel electrode 15 is formed when forming the pixel electrode 14, the pure amorphous silicon 52 and the pixel electrode 14 is short-circuited by the abnormal pixel electrode 15 and thus the signal voltages applied to the pixel electrode 14 is leaked. Therefore, this results in the deterioration of picture quality and of definition.

In order to prevent the short-circuit between the pixel electrode 14 and the amorphous silicon layer 54 (i.e., the active layer), the pixel electrode 14 is spaced apart from the active layer 54 by the distance of length "L" in the conventional LCD device. Thus, the aperture ratio is lowered as much as the distance of length "L". Moreover, since the data line 24 is formed in very close to the pure amorphous silicon layer 52 (i.e., active layer), the electric field appears in the pure amorphous silicon layer 52(i.e., active layer) when the data signals are applied to the data line 24. The electric field appearing in the active layer 52 causes cross-talk with the adjacent pixel electrode 14.

SUMMARY OF THE INVENTION

To overcome the problems described above, an object of the present invention is to provide a method of preventing a short-circuit between a pixel electrode and a active layer when forming the pixel electrode in a thin film transistor (TFT) array substrate used in a liquid crystal display (LCD) device, and the object of the present invention is to provides the TFT array substrate itself.

Another aspect of the present invention is to provide a method of fabricating the array substrate (as well as the TFT array substrate itself) that increases the aperture ratio, moreover, to provide a stable structure of the array substrate for use in LCD device.

Beneficially, such array substrate and a method of fabricating the same increase the throughput and manufacturing yields.

To achieve these and other advantages and in accordance with the purposes of the present invention, as embodied and broadly described, there is provided a TFT array substrate for use in an LCD device that includes a substrate; a gate line over the substrate; a data line over the substrate, a data line being perpendicular to the gate line; a passivation layer covering the data line, the passivation layer divided into a residual passivation layer and a etched passivation layer; a doped amorphous silicon layer formed under the data line and corresponding in size to the data line; a pure amorphous silicon layer formed under the doped amorphous silicon layer and having a over-etched portion in the peripheral portions, wherein the over-etched portion is over-etched from the edges of the residual passivation layer toward the inner side; an insulator layer under the pure amorphous silicon layer; a TFT formed near the crossing of the gate line and the data line; and a pixel electrode overlapping the data line and contacting the TFT.

The pixel electrode is beneficially made of the transparent conductive material such as indium-tin-oxide (ITO) and indium-zinc-oxide (IZO).

To achieve the above aspects, in another aspect, the present invention provides a method of fabricating a TFT array substrate for use in an LCD device. That method includes forming a first metallic layer, a insulator layer, a pure amorphous silicon, a doped amorphous silicon layer and a second metallic layer over a substrate; forming a data line by patterning the second metallic layer; etching the dope amorphous silicon layer to form a channel region using the second metallic layer as a mask; forming a passivation layer over the pure amorphous silicon layer and over the data line; etching the passivation layer, a pure amorphous silicon layer and a insulator layer to form a PAI (Passivation, Active, Insulator) pattern; depositing a transparent conductive material over the over the PAI pattern and on the substrate; forming a photoresist on the transparent conductive material; performing a back exposure to form a pixel electrode; and over-etching the pure amorphous silicon layer of the PAI pattern to form a over-etched portion, wherein a step of over-etching is performed after forming the PAI pattern and before forming the pixel electrode.

The step of over-etching is performed before depositing the transparent conductive material or after depositing the transparent conductive material. The pixel electrode beneficially overlaps the PAI pattern as long as the length of the over-etched portion.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to an illustrated embodiment of the present invention, an example of which is shown in the accompanying drawings.

Figure 1:
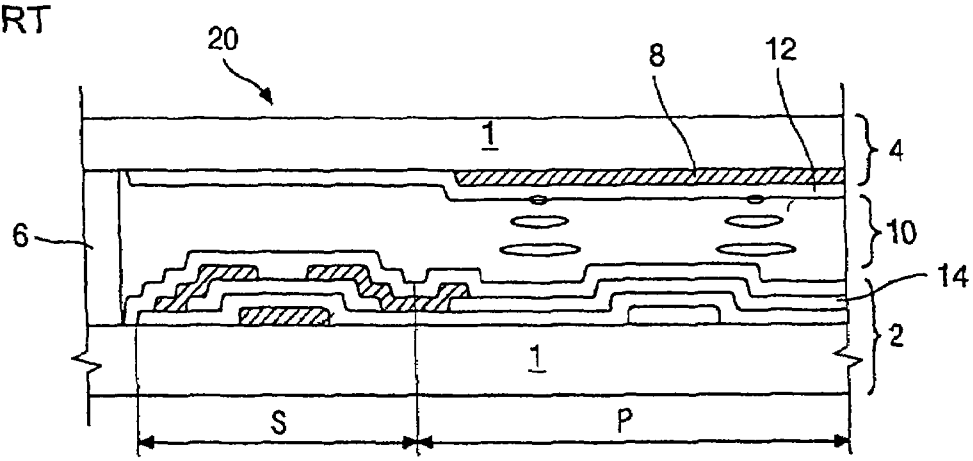
FIG. 1 is a cross-sectional view illustrating a general liquid crystal display (LCD) panel.
Figure 2:
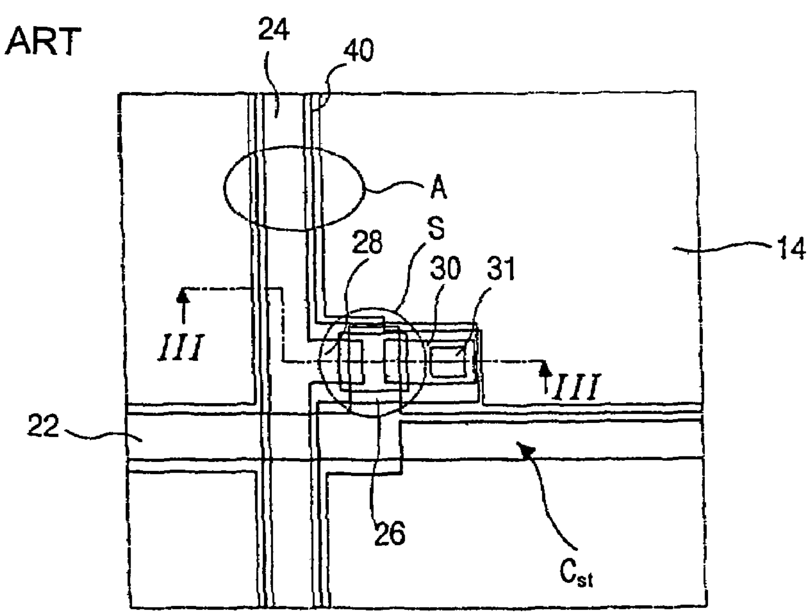
FIG. 2 is a partial plan view illustrating a pixel of a general LCD panel.
Figure 3A:
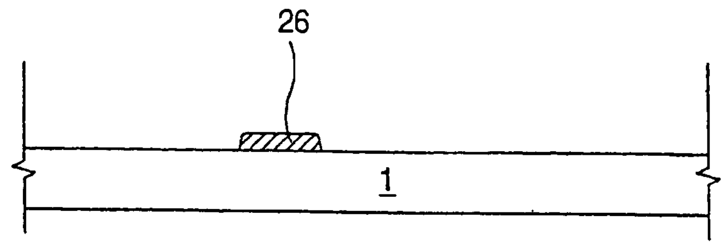
FIGS. 3A to 3D are cross-sectional views taken line III—III of FIG. 2 and illustrate process steps of fabricating a conventional TFT array substrate.
Figure 3B:
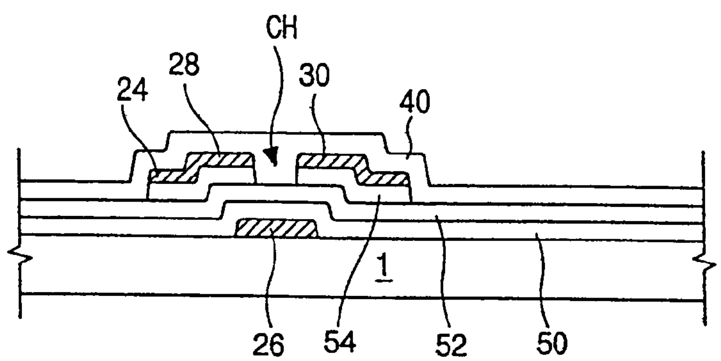
Figure 3C:
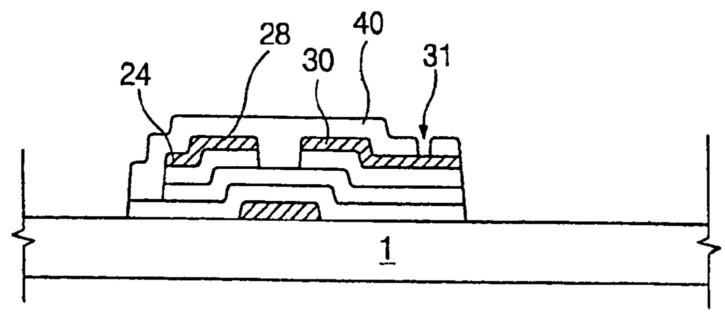
Figure 3D:
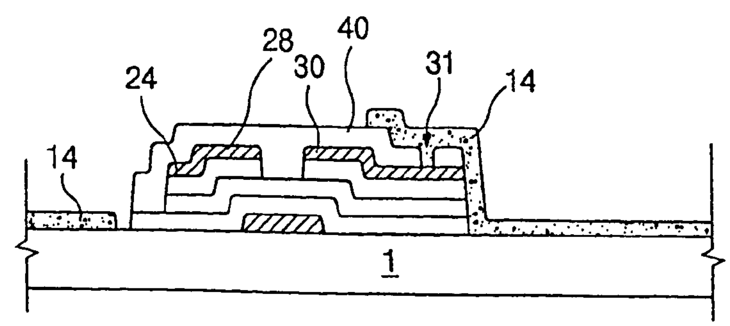
Figure 4:
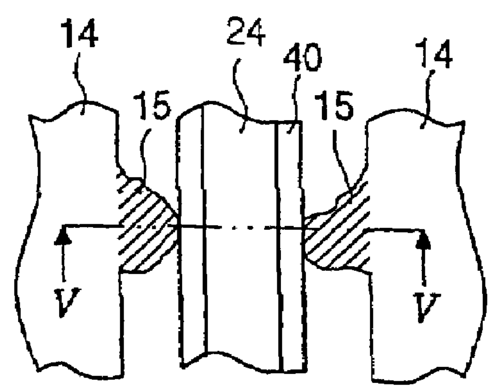
FIG. 4 is an enlarged plan view illustrating a portion "A" of FIG. 2.

FIGS. 6A to 6D are cross-sectional views taken lines III—III of FIG. 2 and V—V of FIG. 4 and illustrate process steps of fabricating an array substrate according to a first preferred embodiment of the present invention. The cross-sectional view taken line III—III shows the TFT (as a switching element) and the cross-sectional view taken line V—V shows the vicinity of the data line.

Figure 6A:
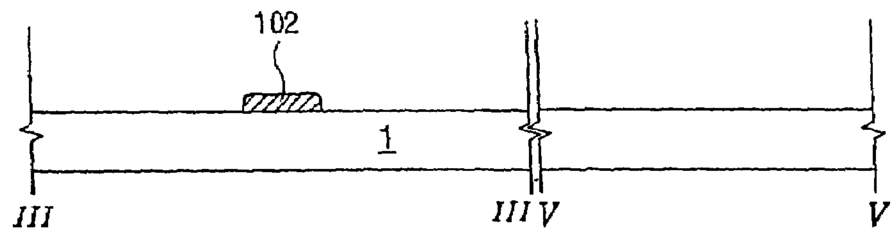
FIGS. 6A to 6D are cross-sectional views taken lines III—III of FIG. 2 and V—V of FIG. 4 and illustrate process steps of fabricating an array substrate according to a first preferred embodiment of the present invention.

Referring to FIG. 6A, a gate electrode 102 is formed by depositing and patterning the first metal layer. The gate electrode 102 is made of a metallic material selected from a group consisting of Chrome (Cr), Molybdenum (Mo) and Tungsten (Ta).

Figure 6B:
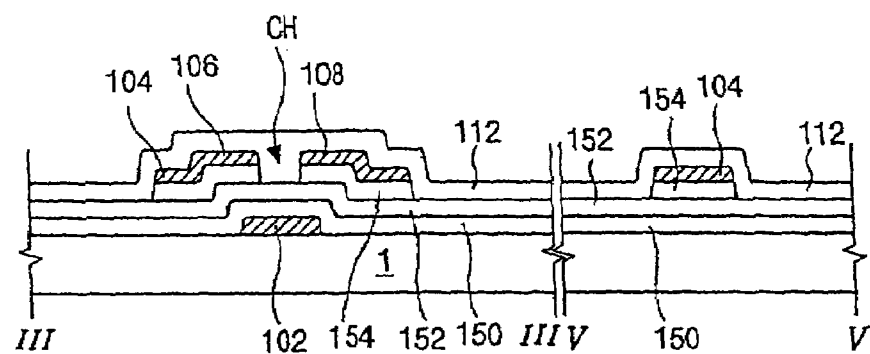

Referring to FIG. 6B, an insulator layer 150 is formed over the surface of the substrate 1 and over the gate electrode 102. Then, a pure amorphous silicon (a-Si:H) layer 152 as an active layer and a doped amorphous silicon ($n^+$ a-Si:H) layer 154 as an ohmic contact layer are formed in sequence on the insulator layer 150. After that, a data line 104 and source and drain electrodes 106 and 108 are formed by depositing and patterning a second metal layer. A portion of the ohmic contact layer 154 on the active layer 152 is etched using the data line 102 and source and drain electrodes 106 and 108 as masks. At this time, a channel region "CH" is formed by removing the portion of the ohmic contact layer 154 using the source and drain electrodes 106 and 108 as masks. If the ohmic contact layer 154 between the source and drain electrodes 106 and 108 is not removed, serious problems that deteriorates electrical characteristics of the TFT "S" (see FIG. 2) can result. And then a passivation layer 112 is formed over the pure amorphous silicon layer 152 and over the source and drain electrodes 106 and 108.

Figure 6C:
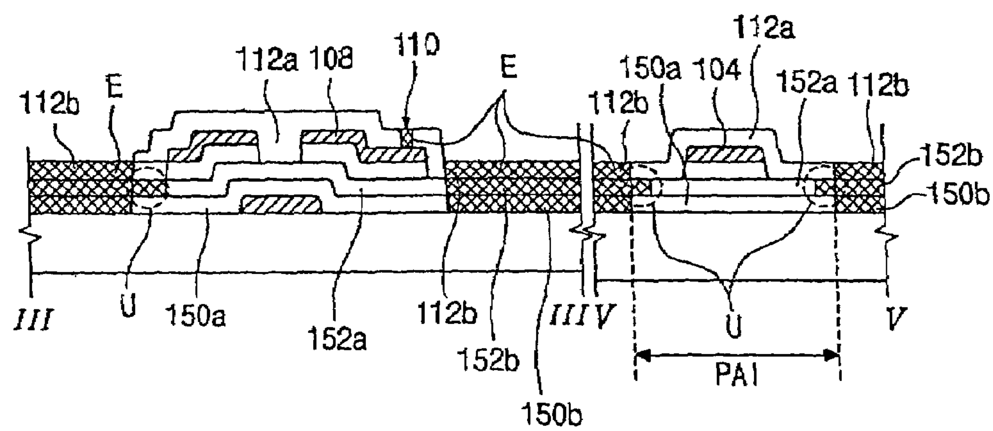

Referring to FIG. 6C, the passivation layer 112 is etched to form a drain contact hole 110 that is used to connect the drain electrode 108 to a pixel electrode that is formed later. At this time, as shown in FIG. 6C, the passivation layer 112 is divided into an etched passivation layer 112*b* and a residual passivation layer 112*a*. The etched passivation layer 112*b* is removed and the residual passivation layer 112*a* is left, in that etching process. Moreover, the active layer 152 is also divided into a residual active layer 152*a* and an etched active layer 152*b*, and the insulator layer 150 is divided into a residual insulator layer 150*a* and an etched insulator layer 150*b*. In the above-mentioned etching process, the residual active layer 152*a* and the residual insulator layer 150*a* are left, and the etched active layer 152*b* and the etched insulator layer 150*b* are removed. Hereinafter, the residual passivation layer 112*a*, the residual active layer 152*a* and the residual insulator layer 150*a* are all together referred to as PAI (Passivation, Active, Insulator) pattern.

The letter "E" denotes the etched passivation layer 112*b*. Moreover, the letter "U" denotes the over-etched portions of the residual active layer 152*a*, which are arranged between the residual passivation layer 112*a* and the residual insulator layer 150*a*. These over-etched portions "U" are usually formed by over-etching the residual active layer 152*a* using the wet etch process or the dry etch process when forming the PAI pattern. This over-etching is due to the fact that the passivation layer 112, the active layer 152 and the insulator layer 150 have different etch selectivity.

Figure 6D:
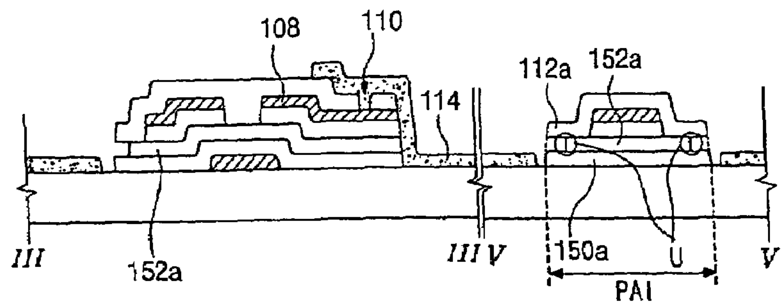

FIG. 6D shows a step of forming a pixel electrode 114 by depositing and then patterning a transparent conductive material such as Indium Tin Oxide (ITO) or Indium Zinc Oxide (IZO). As shown in FIG. 6D, the pixel electrode 114 contacts the drain electrode 108 via the drain contact hole 110. Meanwhile, in the PAI pattern, the residual active layer 152*a* is over-etched from the edges of the residual passivation and insulator layers 112*a* and 150*a* toward the inner side. That means that the residual passivation layer 112*a* has undercut shapes in the over-etched portions "U". As described in FIG. 6C, these over-etching results from the different etch selectivity of the passivation layer 112, of the active layer 152 and of the insulator layer 150.

Figure 7:
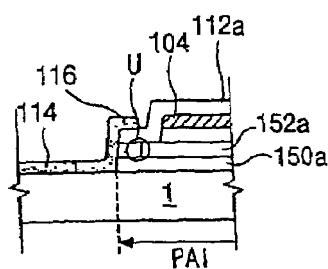
FIG. 7 is an enlarged view illustrating the portion "PAI" of FIG. 6D.

FIG. 7 is an enlarged view illustrating the portion "PAI" of FIG. 6D. As shown, although an abnormal pixel electrode 116 is formed and overlaps the PAI pattern when forming the pixel electrode 114, the point defect caused by the short between the residual active layer 152*a* and the pixel electrode 114 does not appear due to the over-etched portion "U".

Figure 5:
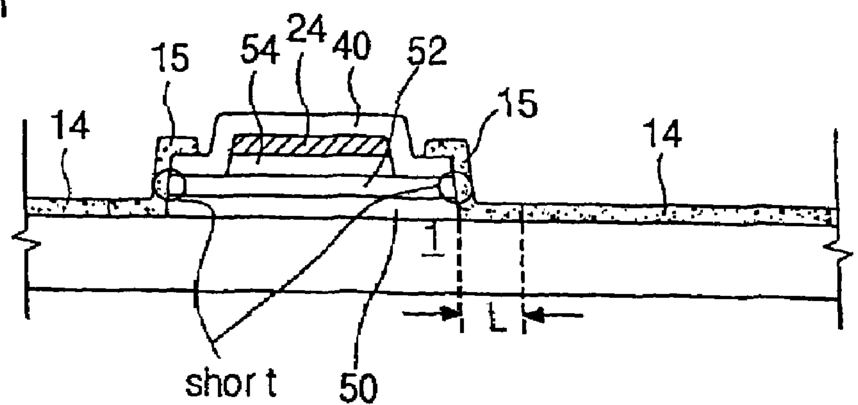
FIG. 5 is a cross-sectional view taken line V—V of FIG. 4.

Referring back to FIG. 5, the point defects caused by the abnormal pixel electrode 15 is shown. Therefore, the pixel electrode 14 should be spaced apart from the active layer 54 by the distance of length "L" in order to prevent the short between the pixel electrode 14 and the amorphous silicon layer 54 (i.e., the active layer). Thus, the aperture ratio is lowered as much as the distance of length "L".

However, as shown in FIG. 7, since the residual active layer 152*a* is over-etched toward the inner side of the PAI pattern of the present invention, the short causing the point defect does not occur. Moreover, since the pixel electrode 114 can overlap the peripheral portion of the PAI pattern, the aperture ratio increases.

Hereinafter, the reference will now be made in detail to an illustrated a second embodiment of the present invention, an example of which is shown in the accompanying drawings.

In the second embodiment of the present invention, a back exposure is used to form a pixel electrode using a negative photoresist. The process steps of the second embodiment of the present invention are similar to the steps depicted in FIGS. 6A to 6D. Therefore, some of drawings are omitted, and the reference will now be explained focused on the PAI pattern.

Figure 8:
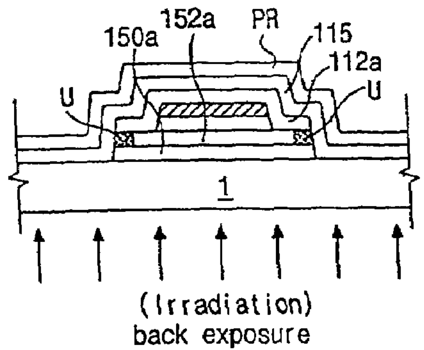
FIG. 8 is a cross-sectional view of the portion "A" of FIG. 2 and illustrates a process step of forming a pixel electrode using a back exposure according to a second preferred embodiment of the present invention.

FIG. 8 is similar to FIG. 6C and shows a step of forming a pixel electrode using the photoresist "PR". The photoresist "PR" is a material which, when being subject to light irradiation, absorbs light energy to cause a photochemical reaction and to form a latent image. To obtain a high aperture ratio, a negative photoresist is preferably used. As shown in FIG. 8, the portion of the photoresist "PR" that does not absorb light is removed during a developing process. Therefore, after depositing a transparent conductive material such as ITO (indium-tin-oxide) or IZO (indium-zinc-oxide) and then sequentially depositing the photoresist "PR", the back exposure is performed. And thus, the transparent conductive material 115 over the PAI pattern is etched because the PAI pattern acts as a mask in the back exposure process.

Figure 9:
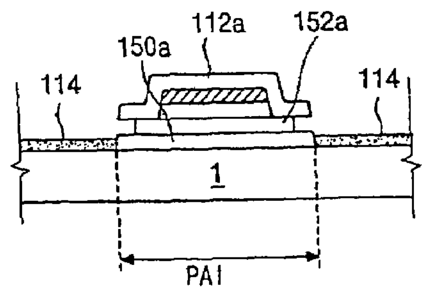
FIG. 9 is a final cross-sectional view of FIG. 8 according to a principle of the second preferred embodiment of the present invention.

FIG. 9 is a final cross-sectional view of FIG. 8 according to a principle of the second preferred embodiment of the present invention. The back exposure is performed before the over-etched portion "U" of FIG. 8 is eliminated. In the back exposure process, the residual active layer 152*a* acts as a mask. Thus, the pixel electrode 114 is attached to the residual insulator layer 150*a*. The over-etched portion "U" (see FIG. 8) of the residual active layer 152*a* is removed after forming the pixel electrode 114.

Figure 10:
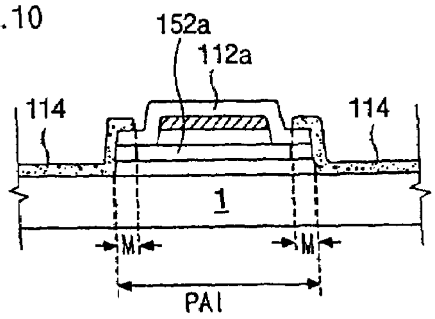
FIG. 10 is another final cross-sectional view of FIG. 8 according to the principle of the second preferred embodiment of the present invention.

FIG. 10 is another final cross-sectional view of FIG. 8 according to the principle of the second preferred embodiment of the present invention. As shown, the over-etched portion "U" of FIG. 8 is removed before the back exposure is performed. In this back exposure process, the residual active layer 152*a* acts as a mask. Thus, the pixel electrode 114 overlaps the peripheral portion of PAI pattern by the length "M". Namely, since the over-etched portion "U" of FIG. 8 is over-etched by the length "M", the pixel electrode 114 is broadened as wide as the length "M".

Referring to FIGS. 9 and 10, the difference between the pixel electrode 114 of FIG. 9 and the pixel electrode 114 of FIG. 10 is whether the back exposure is performed before over-etching the over-etched portion "U" (see FIG. 8) or it is performed after over-etching the over-etched portion "U" (see FIG. 8).

Accordingly, the array substrate of the illustrated embodiment has the following advantages.

First, since there are no spaces between the pixel electrode and the active layer, the high aperture ratio can be achieved.

Second, if the array substrate is fabricated by the embodiment of the present invention, the short between the abnormal pixel electrodes and the active layer can be prevented.

Third, due to the back exposure, the aperture ratio can increase.

Fourth, since the array substrate of the present invention is manufactured by a four-mask process, the throughput and the manufacturing yields can increase.

While the invention has been particularly shown and described with reference to an illustrated embodiment thereof, it will be understood by those skilled in the art that changes in form and details may be made therein without departing from the spirit and scope of the invention.

What is claimed is:

1. A thin film transistor substrate for use in a LCD device, comprising:
- a substrate;
- a gate line over the substrate;
- a data line over the substrate, the data line being perpendicular to the gate line;
- a passivation layer pattern covering the data line, the passivation layer corresponding to and disposed along the data line;
- a doped amorphous silicon layer formed under the data line and corresponding in size to the data line;
- a pure amorphous silicon layer formed under the doped amorphous silicon layer and having an over-etched portion in peripheral portions, wherein the over-etched portion is over-etched from edges of the passivation layer pattern toward an inner side;
- an insulator layer under the pure amorphous silicon layer;
- a TFT formed near a crossing of the gate line and the data line; and
- a pixel electrode contacting the TFT,
- wherein the over-etched portion is over-etched from edges of the passivation layer pattern toward an inner side to be an empty space.

2. The thin film transistor substrate according to claim 1, wherein the pixel electrode is made of the transparent conductive material.

3. The thin film transistor substrate according to claim 2, wherein the transparent conductive material is selected from a group consisting of indium-tin-oxide (ITO) and indium-zinc-oxide (IZO).

4. The thin film transistor substrate according to claim 1, wherein a portion of the pixel electrode overlaps the over-etched portion of the pure amorphous silicon layer.

5. A thin film transistor substrate for use in a LCD device, comprising:
- a substrate;
- a gate line over the substrate;
- a data line over the substrate, the data line being perpendicular to the gate line;
- a TFT formed on the substrate, the TFT including a gate electrode, a source electrode, and a drain electrode;
- a passivation layer pattern covering the TFT and the data line, the passivation layer pattern corresponding to and disposed along the data line;
- a doped amorphous silicon layer formed under the source and drain electrodes;
- a pure amorphous silicon layer formed under the doped amorphous silicon layer and having an over-etched portion at a peripheral portion, wherein the over-etched portion is over-etched from an edge of the passivation layer pattern toward an inner side;
- an insulator layer under the pure amorphous silicon layer; and
- a pixel electrode disposed on the passivation layer,
- wherein the pixel electrode contacting an upper portion and a side portion of the drain electrode and the over-etched portion is over-etched from edges of the passivation layer pattern toward an inner side to be an empty space.

* * * * *